United States Patent
Cho

(10) Patent No.: US 9,349,882 B2
(45) Date of Patent: May 24, 2016

(54) SILICON SOLAR CELL MODULE USING CONDUCTIVE NPASTE AS ELECTRODE AND METHOD FOR MANUFACTURING SAME

(71) Applicant: Gens Engineering Co. Ltd, Daejeon (KR)

(72) Inventor: Soon Haeng Cho, Daejeon (KR)

(73) Assignee: GENS ENGINEERING CO. LTD, Daejeon (KR)

( * ) Notice: Subject to any disclaimer, the term of this patent is extended or adjusted under 35 U.S.C. 154(b) by 0 days.

(21) Appl. No.: 14/371,377

(22) PCT Filed: Dec. 28, 2012

(86) PCT No.: PCT/KR2012/011743
§ 371 (c)(1),
(2) Date: Jul. 9, 2014

(87) PCT Pub. No.: WO2013/105750
PCT Pub. Date: Jul. 18, 2013

(65) Prior Publication Data
US 2015/0004740 A1    Jan. 1, 2015

(30) Foreign Application Priority Data

Jan. 10, 2012   (KR) .................. 10-2012-0002956
Oct. 5, 2012    (KR) .................. 10-2012-0110685

(51) Int. Cl.
*H01L 21/00*     (2006.01)
*H01L 31/0224*   (2006.01)
(Continued)

(52) U.S. Cl.
CPC .......... *H01L 31/022425* (2013.01); *H01B 1/22* (2013.01); *H01L 31/0504* (2013.01); *Y02E 10/50* (2013.01)

(58) Field of Classification Search
CPC ... H01L 31/0224; H01L 31/18; H01L 31/048; Y02E 10/50

USPC .................. 438/57, 65, 69, 80; 257/E31.004, 257/E31.113; 136/244, 251, 252
See application file for complete search history.

(56) References Cited

U.S. PATENT DOCUMENTS 5,385,614 A * 1/1995 Albright et al. ............... 136/244
7,976,735 B2   7/2011 Akimoto
(Continued)

FOREIGN PATENT DOCUMENTS

JP    2008-159917 A    7/2008
KR   10-2010-0075661 A  7/2010
(Continued)

*Primary Examiner* — Charles Garber
*Assistant Examiner* — Abdulfattah Mustapha
(74) *Attorney, Agent, or Firm* — Rabin & Berdo, P.C.

(57) ABSTRACT

The present invention relates to a silicon solar cell module comprising electrodes formed from conductive paste. In the invention, front electrode finger lines and front electrode bus bars are separately formed. The front electrode finger lines are formed by printing a silver paste and calcining the printed silver paste at high temperature, and rear electrode bus bars and front electrode bus bars are formed from an inexpensive lower-temperature conductive paste including a buffer and a curing agent having reducing power, whereby the expensive silver paste is replaced with the inexpensive low-temperature conductive paste, thereby reducing the production cost. Because the front electrode bus bars formed from the conductive paste do not come into contact with the silicon substrate, the area of contact between the silicon substrate and the front electrode is reduced, and thus the decrease in electric current caused by the recombination of electrons and holes resulting from this contact is inhibited, thereby increasing the photovoltaic conversion efficiency of the cell. Also, when the conductive paste is used, the rear electrode and front electrode bus bars are calcined at low temperature, and thus the occurrence of cracks in the silicon substrate is reduced, thereby preventing a decrease in the photovoltaic conversion efficiency of the silicon solar cell and increasing the yield of the cell.

20 Claims, 5 Drawing Sheets

(51) Int. Cl.
*H01L 31/05* (2014.01)
*H01B 1/22* (2006.01)

(56) References Cited

U.S. PATENT DOCUMENTS

| | | |
|---|---|---|
| 8,372,679 B2 | 2/2013 | Anderson et al. |
| 2001/0010857 A1* | 8/2001 | Yagi et al. ............. 428/142 |
| 2009/0211626 A1* | 8/2009 | Akimoto ................ 136/252 |
| 2010/0129960 A1* | 5/2010 | Mejima et al. .......... 438/107 |
| 2010/0170567 A1 | 7/2010 | Akimoto |
| 2010/0294361 A1* | 11/2010 | Anderson et al. ........ 136/256 |
| 2011/0146759 A1* | 6/2011 | Lee et al. ............... 136/249 |

FOREIGN PATENT DOCUMENTS

| | | |
|---|---|---|
| KR | 10-2010-0115011 A | 10/2010 |
| KR | 10-2010-0120218 A | 11/2010 |
| KR | 10-1065751 B1 | 9/2011 |
| KR | 10-2012-0090249 A | 8/2012 |
| WO | WO 2010/135535 A1 | 11/2010 |

* cited by examiner

SILICON SOLAR CELL MODULE USING CONDUCTIVE NPASTE AS ELECTRODE AND METHOD FOR MANUFACTURING SAME

TECHNICAL FIELD

The present invention relates to a silicon solar cell module, and more particularly, to a silicon solar cell module comprising electrodes formed from conductive paste.

BACKGROUND ART

In recent years, due to serious issues such as the imminent exhaustion of fossil fuels, global warming caused by carbon dioxide emissions resulting from the use of fossil fuels, the accident of nuclear power plants, and radioactive contamination caused by nuclear waste, the development of next-generation clean energy sources has been of increasing importance. Among them, solar power generation systems use infinite resources and are semi-permanent, and thus are receiving as a next-generation energy source. Solar cells that are currently used for solar power generation include crystalline silicon solar cells, thin film silicon solar cells, CdTe solar cells, CIGS solar cells, dye-sensitized solar cells, organic solar cells, and concentrated solar cells. Currently, silicon solar cells make up the majority of the marker because of their guaranteed reliability. However, silicon solar cells include expensive silicon substrates and expensive silver and aluminum pastes. Thus, in order to lower the price of silicon solar cells to achieve grid parity, the expensive materials are required to be replaced with inexpensive materials.

A solar cell is a semiconductor device that converts solar light directly into electricity based on the photovoltaic effect in which electrons are produced when light is applied to a semiconductor diode that constitutes a p-n junction. In a method for fabricating a general silicon solar cell, a pentavalent element is thermally diffused into a p-type silicon substrate to form an n-type layer on the front surface of the silicon substrate, thereby forming a p-n junction in the silicon substrate. On the n-type layer, a silicon nitride film is deposited to form an antireflective layer. A front electrode on the antireflective layer on the silicon substrate is generally composed of a plurality of parallel finger lines having a narrow width (70-100 μm) and a plurality of bus bars perpendicular to the finger lines and having a large width (1.5-2 mm). The front electrode is formed by screen-printing silver paste at high temperature. The rear surface of the silicon substrate is completely covered with aluminum paste. The aluminum rear electrode may have poor electrical/mechanical contact with a metal ribbon that provides a connection between cells, due to the oxidation of its surface. For this reason, aluminum/silver paste is screen-printed on the rear electrode to form rear bus bars. The front and rear electrode pastes are calcined at a temperature of 800° C. At this time, the silver paste of the front electrode penetrates through the antireflective layer so as to be connected with the n-type layer.

A voltage that can be obtained in a unit silicon solar cell is generally 1V or lower, which is very lower than a practically useful level. For this reason, a silicon solar cell module that generates power using solar cells includes a plurality of solar cells connected in series and parallel so as to generate a desired voltage and current. As shown in FIG. 1, a general silicon solar cell module is fabricated by connecting the front electrode bus bars and rear electrode bus bars of silicon solar cells to one another by a metal ribbon to make a silicon solar cell array, encapsulating the array with an encapsulation resin including EVA (ethylene vinyl acetate) and PVB (poly vinyl butyral), and laminating a glass sheet on the front surface and a back sheet on the rear surface of the array.

Silver that is used in the front electrode and rear electrode bus bars of a silicon solar cell is an expensive rare metal. In recent years, the price of silver has recently increased rapidly. For this reason, it is required to reduce the use of silver or replace silver with other inexpensive materials. In order to form a front electrode using a paste of an inexpensive metal such as copper or nickel instead of silver, the metal paste that is used for the front electrode should satisfy the following requirements:

1) The resistivity of the metal paste is as low as that of a high temperature silver paste, so that the metal paste does not reduce the solar cell conversion efficiency.

2) The metal paste should be easily soldered to a metal ribbon that provides a connection between cells, so that it is electrically or mechanically easily connected with the metal ribbon.

3) Because a solar cell module should be used for 20 years or more in the open air, the metal paste should not undergo oxidative corrosion when it is used in this environment for a long period of time.

However, a paste of an inexpensive metal such as copper or nickel, which is currently used, produces a metal oxide film when it is calcined. This oxide film is a non-conductive, and thus has a problem in that it interferes with the electrical or mechanical connection between metal particles in the paste and between the front and rear electrode bus bars and the metal ribbon. Moreover, because the metal powder is surrounded by the polymer of the resin and strongly bonded with the resin, it is not easily soldered to the metal ribbon. Particularly, when the metal paste composed of copper powder is exposed to air or moisture for a long period of time, it can be oxidized (corroded) to increase the electrical resistance of the electrode to thereby reduce the light conversion efficiency of the solar cell module.

In the prior art, Korean Patent Laid-Open Publication No. 2010-75661 discloses a conductive paste for a solar cell device, which contains conductive particles, an organic binder, a solvent, glass frit, an organic compound containing an alkaline earth metal, and a low-melting-point metal or a low-melting-point metal-based compound. According to the disclosure of the above patent publication, an alkaline earth metal is used as a low-melting-point metal in order to prevent either micro-cracks from occurring or contact resistance from increasing when printing, drying and calcining a conductive paste on the surface of a semiconductor substrate. However, the above patent publication does not describe that finger lines and bus lines comprise different components.

In addition, Korean Patent Laid-Open Publication No. 2012-90249 discloses an interconnection perpendicular to a finger electrode. According to the disclosure of this patent publication, a bus bar electrode that intersects a finger electrode and is in a line with an interconnection may not be included while the bus bar electrode generally comprises an electrode paste composed of an expensive material such as silver (Ag). Also, it discloses that, when the bus bar electrode is omitted, the amount of electrode paste used to form the bus bar electrode can be reduced, and a process for forming the bus bar electrode can be omitted, thereby greatly reducing the production cost. In addition, it discloses that the interconnection can be connected to a plurality of finger electrodes by a conductive film or a conductive paste without using a bus bar electrode and that the conductive film comprises a plurality of conductive particles made of a metal (e.g., nickel (Ni)) in epoxy resin and also that the conductive particles may have a size of 3-10 μm. However, it does not recognize the effect of the difference in the paste component between the finger electrode and the bus bar on processes or costs.

DISCLOSURE OF INVENTION

The present invention is directed to a silicon solar cell module comprising electrodes formed from conductive paste. In the present invention, front electrode finger lines and bus bars are separately formed. Specifically, front electrode finger lines are formed by printing a silver paste and calcining the printed paste at high temperature, and front and rear electrode bus bars are formed from a low-temperature inexpensive conductive paste, which includes a curing agent having reducing power and a buffer, in place of an expensive conductive paste, thereby reducing the production cost. Front electrode bas bars formed from a conductive paste according to the present invention do not come into contact with a silicon substrate, and thus the area of contact between the silicon substrate and the front electrode is reduced. Accordingly, the decrease in electric current caused by the recombination of electrons and holes resulting from this contact is inhibited, thereby increasing the photovoltaic conversion efficiency of the solar cell. In addition, when the conductive paste according to the present invention is used, front and rear bus bars can be calcined at low temperatures, and thus the occurrence of cracks in the silicon substrate can be reduced, thereby preventing a decrease in the photovoltaic conversion efficiency of the silicon solar cell and increasing the yield of the silicon solar cell.

BEST MODE FOR CARRYING OUT THE INVENTION

Figure 1:
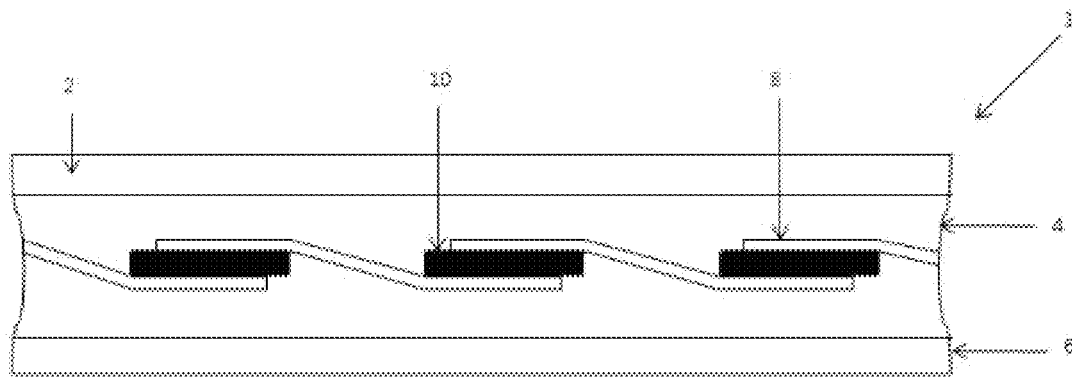
FIG. 1 is a side view schematically showing a silicon solar cell module comprising electrodes formed from a conductive paste according to an embodiment of the present invention.

In order to replace expensive silver for the front and rear electrodes of a silicon solar cell with conductive pastes including inexpensive copper or nickel, these conductive pastes require reducing agents for removing metal oxide, and these reducing agents show no reducing effect due to volatilization at a temperature of 500° C. For this reason, these pastes are not suitable for use as a front electrode that is calcined at a temperature of 800° C. or higher so as to penetrate through an antireflective layer. However, a front electrode finger line and a bus bar have different functions. The front electrode finger line is electrically connected to a silicon substrate so as to function to capture charges, whereas the front electrode bus bar functions to capture charges from the front electrode finger lines and transfer the charges to a metal ribbon that connects cells to each other. Also, the front electrode bus bar is bonded to the metal ribbon so as to mechanically support the metal ribbon. Thus, in the present invention, the front electrode finger line and the front electrode bus bar are separately formed. Specifically, the front electrode finger lines are formed by printing a high-temperature silver paste and calcining the printed paste at high temperature, and the rear electrode and front electrode bus bars are formed by printing an inexpensive low-temperature conductive paste and calcining the printed paste at low temperature (200~300° C.), whereby 60% or more of the expensive silver paste is replaced with the inexpensive low-temperature conductive paste, thereby reducing the production cost. Because the front electrode bus bar formed from the conductive paste according to the present invention does not come into contact with the silicon substrate, the area of contact between the silicon substrate and the front electrode is reduced by 40% or more, and thus the decrease in electric current caused by the recombination of electrons and holes resulting from this contact is inhibited, thereby increasing the photovoltaic conversion efficiency of the cell. When the conductive paste according to the present invention is used, the rear electrode and front electrode bus bars can be calcined at low temperature, and thus the occurrence of stress in the silicon substrate can be reduced to reduce the occurrence of cracks in the silicon substrate, thereby preventing a decrease in the photovoltaic conversion efficiency of the silicon solar cell and increasing the yield of the cell.

The present invention provides a silicon solar cell module comprising:

(1) a plurality of silicon solar cells, each comprising: (a) a silicon substrate having a p-n junction near the front surface of the substrate; (b) a first electrode electrically and mechanically connected to the rear surface of the silicon substrate; (c) an array of third elongate parallel electrodes electrically and mechanically connected to the front surface of the silicon substrate; (d) at least one fourth electrode connected electrically and mechanically to the third electrodes and being at a distance from the front surface of the silicon substrate and formed from a conductive paste including solder powder, metal powder and a resin including a curing agent having reducing power; and (e) an antireflective layer covering the third electrodes on the front surface of the silicon substrate;

(2) a plurality of metal ribbons that provide a connection between the plurality of silicon solar cells;

(3) an encapsulation resin encapsulating the plurality of silicon solar cells and the plurality of metal ribbons;

(4) a front glass substrate placed on the upper side of the encapsulation resin; and (5) a back sheet placed on the lower side of the encapsulation resin.

The present invention also provides a silicon solar cell module comprising:

(1) a plurality of silicon solar cells, each comprising (a) a silicon substrate having a p-n junction near the front surface of the substrate; (b) a first electrode electrically and mechanically connected to the rear surface of the silicon substrate; (c) at least one second electrode connected electrically and mechanically connected to the first electrode on the rear surface of the silicon substrate and formed from a conductive paste, which includes solder powder, metal powder and a resin including a curing agent having reducing power, so as to be electrically and mechanically connected to metal ribbons that provide a connection between the plurality of silicon solar cells; (d) an array of third elongate and parallel electrodes electrically and mechanically connected to the front surface of the silicon substrate; (e) at least one fourth electrode electrically and mechanically connected to the third electrodes; and (f) an antireflective layer that covers the third electrodes on the front surface of the silicon substrate and comes into contact with the silicon substrate;

(2) a plurality of metal ribbons that provide a connection between the plurality of silicon solar cells;

(3) an encapsulation resin encapsulating the plurality of silicon solar cells and the plurality of metal ribbons;

(4) a front glass substrate placed on the upper side of the encapsulation resin; and (5) a back sheet placed on the lower side of the encapsulation resin.

In the following description, the first electrode, the second electrode, the third electrode and the fourth electrode are referred to as rear electrode, rear electrode bus bar, front electrode finger line array and front electrode bus bar, respectively.

The present invention will be described in detail with reference to the accompanying drawings. FIG. 1 shows an improved silicon solar cell module 1 according to the present invention. The silicon solar cell module 1 comprises: silicon solar cells 10 comprising the front electrode and rear electrode bus bars formed from a conductive paste according to the present invention; metal ribbons 8 connecting the cells 10 to one another; a silicon solar cell array composed of the cells 10 and the metal ribbons 8; an encapsulation resin 4 encapsulating the silicon solar cell array; a front glass substrate 2; and a back sheet 6. The silicon solar cell module according to the present invention is fabricated by connecting the front electrode and rear electrode bus bars (formed from the conductive paste of the present invention) of the silicon solar cells 10 to one another by the metal ribbons 8 to make a silicon solar cell array, encapsulating the array with the encapsulation resin 4 such as EVA (ethylene vinyl acetate) or PVB (poly vinyl butyral) resin, and laminating the glass substrate 2 on the front surface and the back sheet 6 on the rear surface.

Figure 2:
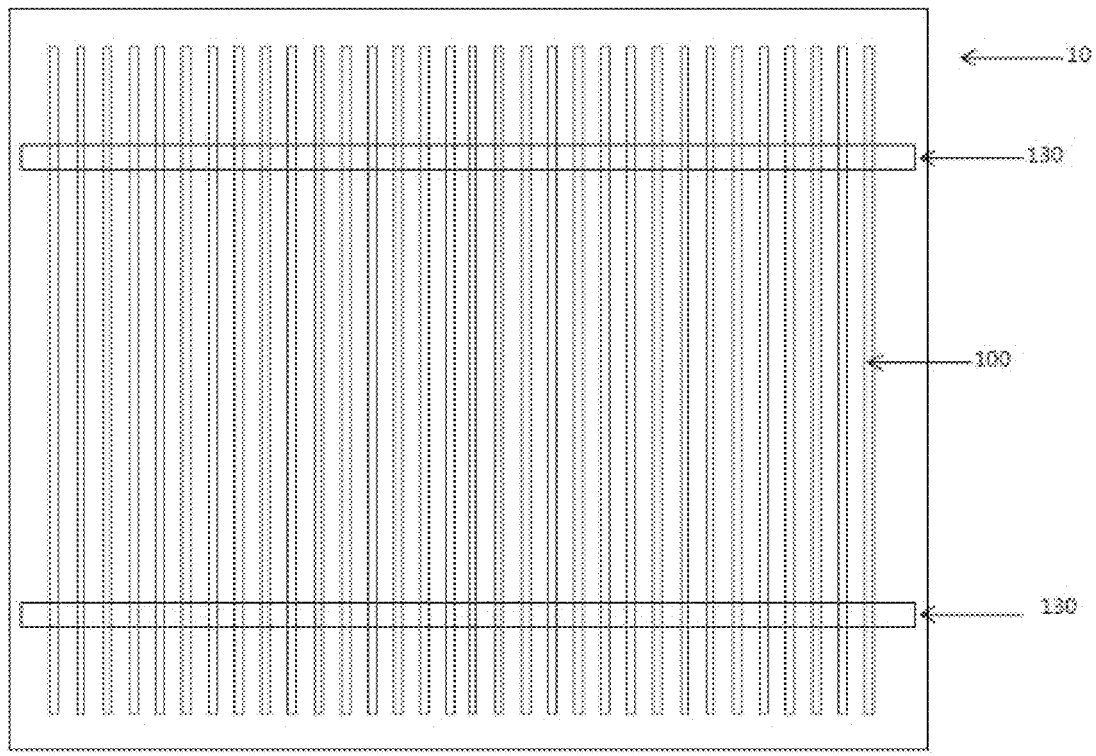
FIG. 2 is a top view schematically showing the front surface of a silicon solar cell comprising electrodes formed from a conductive paste according to an embodiment of the present invention.
Figure 3:
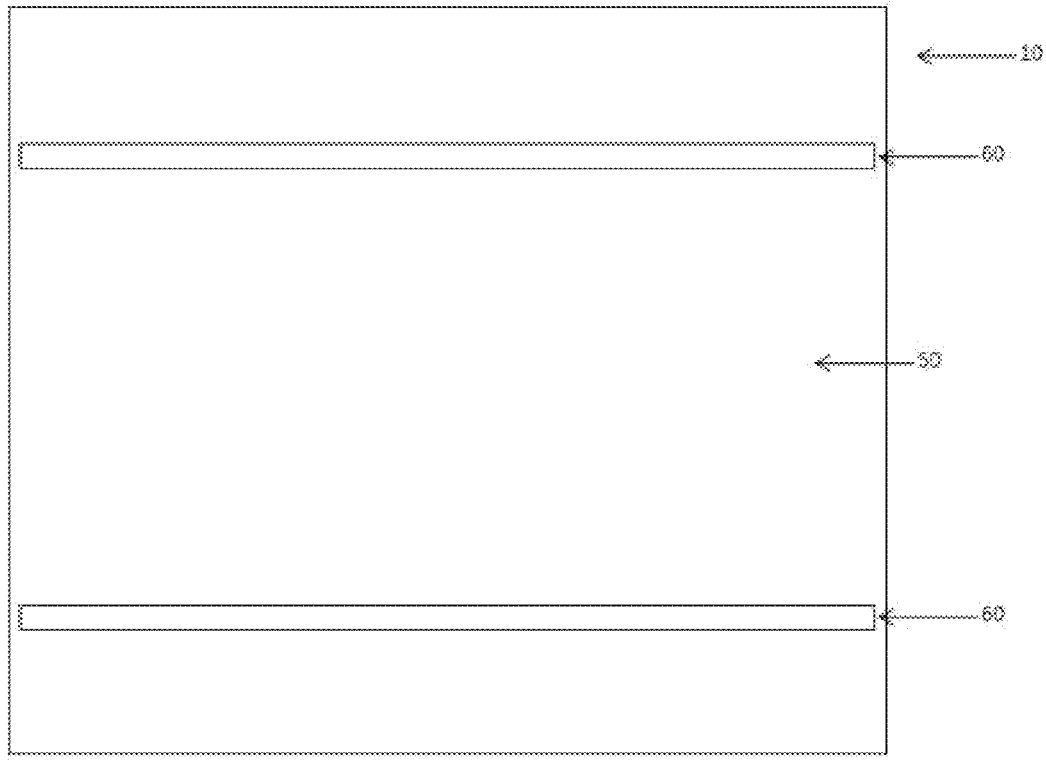
FIG. 3 is a bottom view schematically showing the rear surface of a silicon solar cell comprising electrodes formed from a conductive paste according to an embodiment of the present invention.

FIG. 2 is a top view showing the front surface of the silicon solar cell 10 and shows front electrode finger lines 100 and front electrode bus bars 130 on a silicon substrate. FIG. 3 is a bottom view showing the rear surface of the silicon solar cell 10 and shows a rear electrode 50 and rear electrode bus bars 60 on the silicon substrate.

Figure 4:
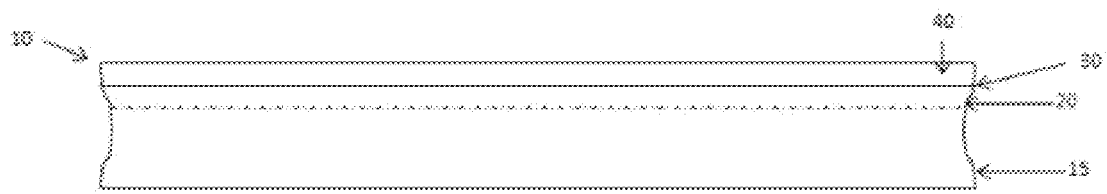
FIG. 4 is a side view showing a substrate having a p-n junction near the surface and an antireflective layer thereon.
Figure 5:
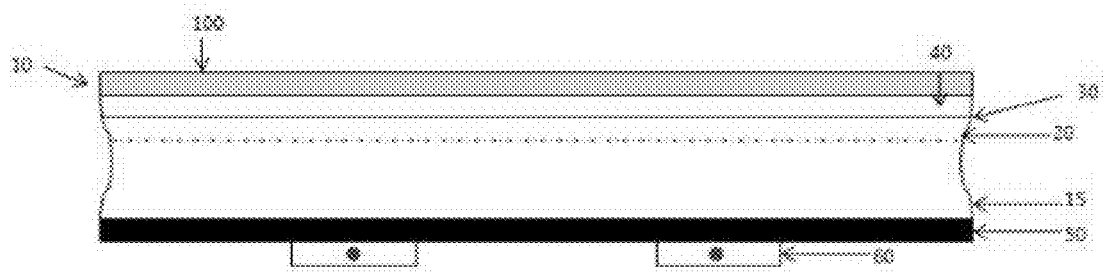
FIG. 5 is a side cross-sectional view taken along the front electrode finger line of a silicon substrate fabricated by printing an aluminum paste on the rear surface of the silicon substrate of FIG. 4 to form a rear electrode, printing an aluminum/silver paste to form rear bus bars, and forming a silver paste to form front electrode finger lines.
Figure 6:
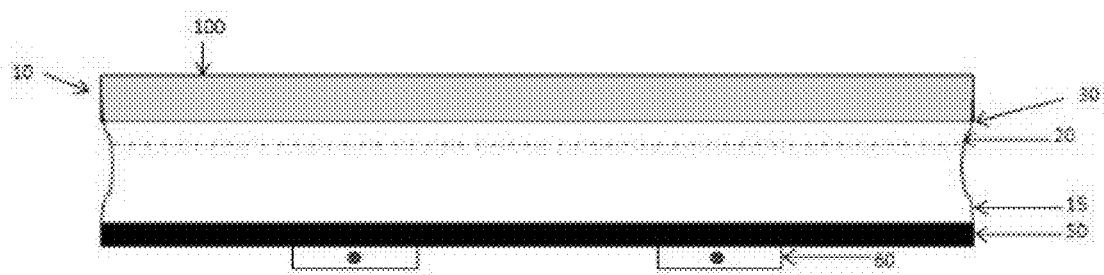
FIG. 6 is a side cross-sectional view taken along the front electrode finger line of a silicon substrate fabricated by calcining the silicon substrate of FIG. 5, which has the front and rear electrode pastes printed thereon, at high temperature so as to allow the silver paste of the front electrode finger lines to penetrate through the antireflective layer to come into contact with the silicon substrate.
Figure 7:
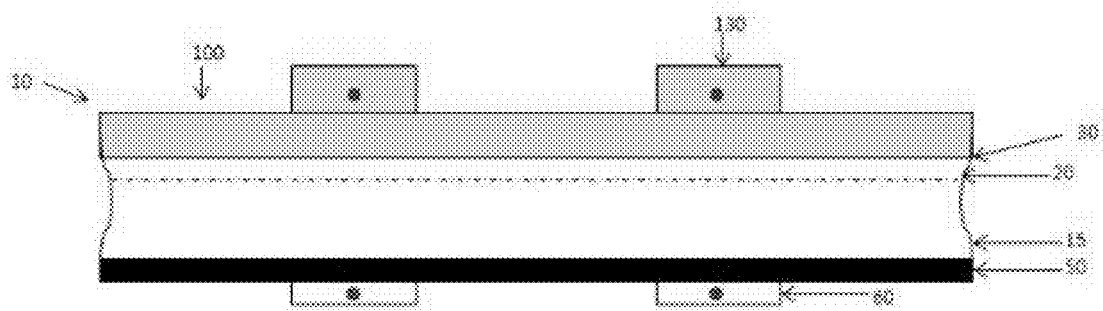
FIG. 7 is a side cross-sectional view taken along the front electrode finger line of a silicon solar cell fabricated by printing a conductive paste according to an embodiment of the present invention on the silicon substrate of FIG. 6 and calcining the printed conductive paste at low temperature to form front electrode bus bars.

FIGS. 4 to 6 show an example of a silicon solar cell comprising front electrode bus bars formed from the conductive paste according to the present invention. As shown in FIG. 4 and as well known in the art, the silicon solar cell 10 comprises a silicon substrate 15 having a shallow p-n junction 20 near the surface 30 of the substrate 15. An antireflective layer 40 is deposited on the silicon substrate 15 and may be made of silicon nitride or silicon oxide and aluminum oxide. FIG. 5 shows a front electrode and a rear electrode, which are used for electrical connection on the silicon substrate 15. On the rear surface of the silicon substrate 15, an aluminum paste is generally printed to form a rear electrode 50. To electrically and mechanically connect the rear electrode 50 to the metal ribbon 8, an aluminum/silver paste is generally printed to form a rear electrode bus bar 60. On the antireflective layer on the front surface of the silicon substrate 15, a silver paste having good conductivity is printed to form an array of elongate front electrode finger lines. In the present invention, front electrode bus bars are not printed in this process and are separately printed and calcined in a subsequent process, unlike the case of conventional silicon solar cells. When the silicon substrate 15 of FIG. 5, which comprises the printed front electrode finger line paste and the rear electrode and rear bus bar pastes is calcined at high temperature (800° C. or higher), the front electrode finger line paste and the rear electrode and rear bus bar pastes are converted to the front electrode finger lines and the rear electrode and rear bus bars as shown in FIG. 6. At this time, the silver paste of the front electrode finger lines penetrates through the antireflective layer so as to be electrically connected to the silicon substrate. In the present invention, as shown in FIG. 7, after the high-temperature calcining process, the conductive paste according to the present invention is printed on the front electrode and calcined at low temperature (200~300° C.) to form front electrode bus bars, thereby fabricating a silicon solar cell according to the present invention.

Figure 8:
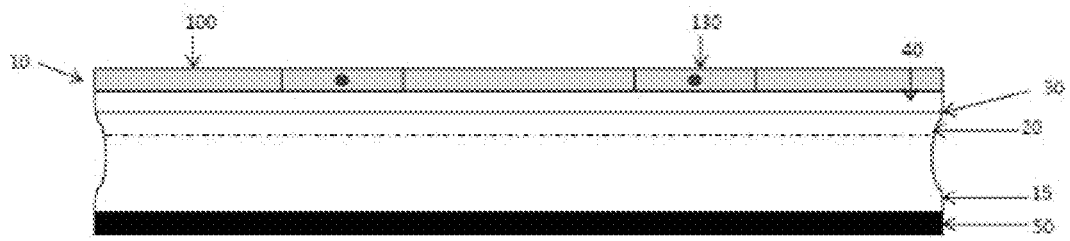
FIG. 8 is a side cross-sectional view taken along the front electrode finger line of a silicon substrate fabricated by printing an aluminum paste on the rear surface of the silicon substrate of FIG. 4 to form a rear electrode and printing a silver paste for use at high temperatures to form front electrode finger lines and bus bars.
Figure 9:
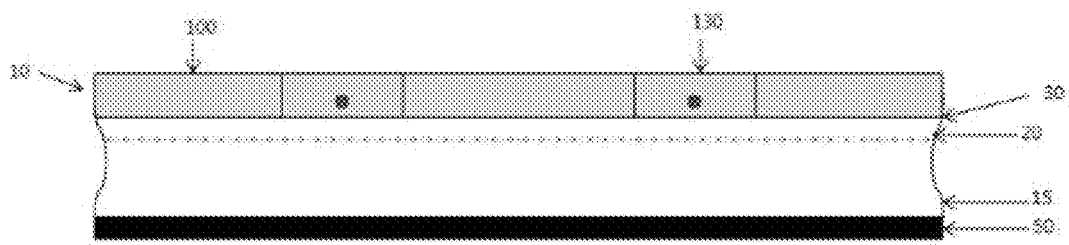
FIG. 9 is a side cross-sectional view taken along the front electrode finger line of a silicon substrate fabricated by calcining the silicon substrate of FIG. 8, which has the front electrode finger line and bus bar and rear electrode pastes printed thereon, at high temperature so as to allow the silver paste of the front electrode finger lines and bus bars to penetrate through the antireflective layer to come into contact with the silicon substrate.
Figure 10:
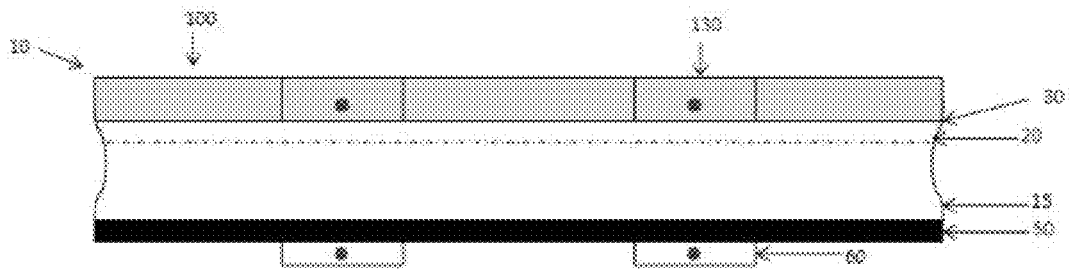
FIG. 10 is a side cross-sectional view taken along the front electrode finger line of a silicon solar cell fabricated by printing a conductive paste according to an embodiment of the present invention on the rear electrode of the silicon substrate of FIG. 9 and calcining the printed paste at low temperature to form rear electrode bus bars.

The conductive paste according to the present invention may also be used to form rear electrode bus bars for a silicon solar cell. FIGS. 8 to 10 show an example of a silicon solar cell comprising rear electrode bus bars formed from the conductive paste according to the present invention. FIG. 8 shows a front electrode and a rear electrode, which are used for electrical connection on the silicon substrate 15 shown in FIG. 4. An aluminum paste is generally printed on the rear surface of the silicon substrate 15 to form a rear electrode 50. On the antireflective layer on the front surface of the silicon substrate 15, a high-temperature silver paste having good conductivity is printed to form an elongate finger line array 100 and front electrode bus bars 130. In the present invention, rear electrode bus bars are not printed in this process and are separately printed and calcined in a subsequent process, unlike the case of conventional silicon solar cells. When the silicon substrate 15 of FIG. 8 which comprises the printed front electrode finger line and front electrode bus bar paste and the printed rear electrode paste is calcined at high temperature (800° C. or higher), the front electrode finer line and front electrode bus bar paste and the rear electrode paste are converted to front electrode finger lines, front electrode bus bars and a rear electrode as shown in FIG. 9. At this time, the silver paste of the front electrode finger lines and the front electrode bus bars penetrates through the antireflective layer so as to be electrically connected to the silicon substrate. In the present invention, as shown in FIG. 10, after the high-temperature calcining process, the conductive paste according to the present invention is printed on the rear electrode and calcined at low temperature (200~300° C.) to form rear electrode bus bars 60, thereby fabricating a silicon solar cell according to the present invention.

Figure 11:
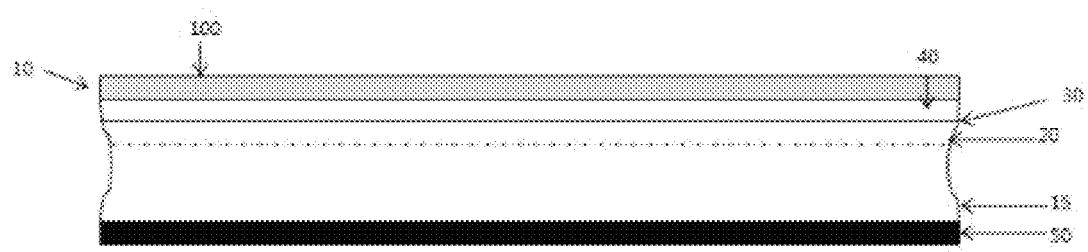
FIG. 11 is a side cross-sectional view taken along the front electrode finger line of a silicon substrate fabricated by printing an aluminum paste on the rear surface of the silicon substrate of FIG. 4 and printing a silver paste for use at high temperatures to form front electrode finger lines.
Figure 12:
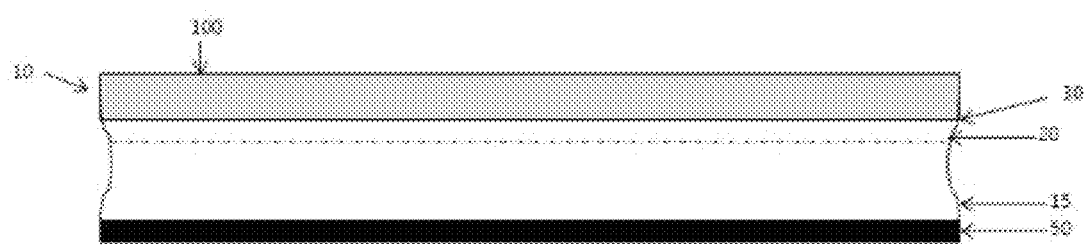
FIG. 12 is a side cross-sectional view taken along the front electrode finger line of a silicon substrate fabricated by calcining the silicon substrate of FIG. 11, which has the front electrode finger line and rear electrode pastes printed thereon, at high temperature so as to allow the silver paste of the front electrode finger lines to penetrate through the antireflective layer to come into contact with the silicon substrate.
Figure 13:
FIG. 13 is a side cross-sectional view taken along the front electrode finger line of a silicon solar cell fabricated by printing a conductive paste according to an embodiment of the present invention on the rear electrode of the silicon substrate of FIG. 12 to form rear electrode bus bars, printing a conductive paste according to an embodiment of the present invention on the front electrode finger lines to form front electrode bus bars, and calcining the printed pastes at low temperature.

The conductive paste according to the present invention may also be used to form both front electrode bus bars and rear electrode bus bars for a silicon solar cell. FIGS. 11 to 13 show an example of a silicon solar cell comprising the rear electrode bus bars and front electrode bus bars formed from the conductive paste according to the present invention. FIG. 11 shows a front electrode and a rear electrode, which are used for electrical connection on the silicon substrate 15 shown in FIG. 4. On the rear surface of the silicon substrate 15, an aluminum paste is generally printed to form a rear electrode 50. On the antireflective layer on the front surface of the silicon substrate 15, a high-temperature silver paste having good conductivity is printed to form an elongate front finger line array. In the present invention, rear electrode bus bars and front electrode bus bars are not printed in this process and are separately printed and calcined in a subsequent process, unlike the case of conventional silicon solar cells. When the silicon substrate 15 of FIG. 11 which comprises the printed front electrode finger line paste and the printed rear electrode paste is calcined at high temperature (800° C. or higher), the front electrode finer line paste and the rear electrode paste are converted to front electrode finger lines and a rear electrode as shown in FIG. 8. At this time, the silver paste of the front electrode finger lines penetrates through the antireflective layer so as to be electrically connected to the silicon substrate. In the present invention, as shown in FIG. 13, after the high-temperature calcining process, the conductive paste according to the present invention is printed on the rear electrode and on the front electrode finger lines and calcined at low temperature (200~300° C.) to form rear electrode bus bars and front electrode bus bars, thereby fabricating a silicon solar cell according to the present invention.

The conductive paste that is used to form rear electrode bus bars and front electrode bus bars for a silicon solar cell according to the present invention can be printed using various printing processes, including screen printing, stencil printing and ink-jet printing processes.

The conductive paste that is used in the present invention is used to form front electrode bus bars for a silicon solar cell, which function to capture charges from front electrode finger lines and transfer the captured charges to metal ribbons that connect cells to one another. In addition, front electrode bus bars and rear electrode bus bars are connected to metal ribbons so as to function to mechanically support the metal ribbons. Thus, the conductive paste that is used in the present invention comprises metal powder, solder powder, and a curable resin including a buffer and a curing agent having reducing power. The metal powder that is used in the conductive paste may be made of a material selected from among copper, nickel, silver, gold, aluminum, platinum, iron, cobalt, molybdenum, and alloys thereof, which are metal materials having a high melting point and capable of an intermetallic compound with solder powder. Copper is most preferable in terms of economy and low electrical resistance. In view of electrical properties, the metal powder preferably has a particle size of 5-20 μm and is preferably spherical in shape.

The solder powder that is used in the conductive paste of the present invention comes into contact with the metal powder to make a compound that provides a matrix through which electricity flows. When resin is filled into the matrix and cured, the front electrode bus bars become mechanically hard. These front electrode bus bars are bonded to metal ribbons connecting cells to one another so as to function to mechanically support the metal ribbons. The solder powder may be made of a material selected from among Sn, Pb, Bi, Zn, Ga, Hg, Sb, In, and alloys thereof. The solder powder is most preferably made of $Sn_{63}Pb_{37}$ in terms of economy and low electrical resistance. In view of electrical properties, the metal powder preferably has a particle size of 5-20 μm and is preferably spherical in shape.

The curable resin that is used in the present invention is a binder including metal powder, solder powder, a buffer and a curing agent having reducing powder. It functions to bond the front electrode bus bars to the antireflective layer when the conductive paste is calcined and cured. In addition, it functions to fill and mechanically support the matrix composed of the metal compound formed of metal powder and solder powder. When temperature starts to increase during the calcining of the conductive paste, the viscosity of the curable resin decreases so that the curing agent having reducing power moves to the metal powder and the solder powder and reduces metal oxides on the surface of the metal powder and the solder powder. However, the curing agent having reducing power is generally a strong acid or alkali material and reduces the adhesive strength of the curable resin when it is present alone in the curable resin. Particularly, it can reduce the adhesion of the curable resin to a metal. For this reason, a buffer is required to be included in the curable resin in order to prevent the conductive paste from delaminating after calcining due to this decrease in adhesive strength. This buffer prevents the adhesive strength of the curable resin from being decreased by the curing agent having reducing powder, thereby preventing the conductive paste from delaminating after calcining. The curable resin that is used in the present invention may be an epoxy or phenolic resin. The curing agent having reducing power, which is used in the present invention, may be selected from among anhydrides, carboxylic acids, amides, amines, and phenols. A buffer for buffering the curing agent having reducing power may be selected from among alcohols, glycols, and polyols. However, the curable resin, the curing agent having reducing power, the buffer, and the composition ratio thereof should be determined depending on the ability to reduce metal oxides, the ability to adhere to the antireflective layer, and solderability to the metal ribbons.

When the metal powder is made of copper, the composition ratio at which the copper powder is completely alloyed with the solder powder should be used in order to prevent the copper of the front electrode bus bars from being oxidized in an external environment, thereby increasing the reliability of the cell. In this case, the copper powder is not present in the front electrode bus bars after calcining of the conductive paste, so that the oxidation (corrosion) of copper powder does not occur. In addition, the content of tin (Sn) in the solder powder should be higher than that of copper (83.3 mole %).

The present invention also provides a method for fabricating a silicon solar cell module, the method comprising the steps of:

(1) fabricating a plurality of silicon solar cells by: (a) fabricating a silicon substrate having a p-n junction near the front surface of the silicon substrate; (b) forming an antireflective layer on the silicon substrate; (c) printing and calcining a metal paste on the rear surface of the silicon substrate to form a first electrode; (d) printing and calcining a glass frit-containing metal paste on the front surface of the silicon substrate to a third electrode; and (e) printing and calcining the conductive paste of the present invention on the third electrode to form a fourth electrode;

(2) connecting the plurality of silicon solar cells to one another by a plurality of metal ribbons, thereby fabricating a silicon solar cell array; and (3) encapsulating the silicon solar cell array with an encapsulation resin and laminating a glass substrate on the upper surface of the encapsulation resin and a back sheet on the lower surface of the encapsulation resin, thereby fabricating a silicon solar cell module.

In the method for fabricating the silicon solar cell module according to the present invention, the silicon solar cells may also be fabricated by: (a) fabricating a silicon substrate having a p-n junction near the front surface of the silicon substrate; (b) forming an antireflective layer on the silicon substrate; (c) printing a conductive paste on the rear surface of the silicon substrate to form a first electrode; (d) printing a conductive paste on the front surface of the silicon substrate to form a third electrode and a fourth electrode; (e) calcining the silicon substrate, the antireflective layer, the first electrode, the third electrode, and the fourth electrode; and (f) printing and calcining the conductive paste of the present invention on the first electrode to form a second electrode.

In addition, in the method for fabricating the silicon solar cell module according to the present invention, the silicon solar cells may also be fabricated by: (a) fabricating a silicon substrate having a p-n junction near the front surface of the silicon substrate; (b) forming an antireflective layer on the silicon substrate; (c) printing a conductive paste on the rear surface of the silicon substrate to form a first electrode to form a first electrode; (d) printing a conductive paste on the front surface of the silicon substrate to form a third electrode; (e) calcining the silicon substrate, the antireflective layer, the first electrode and the third electrode; (f) printing and calcining the conductive paste of the present invention on the first electrode to form a second electrode and printing and calcining the conductive paste of the present invention on the third electrode to form a fourth electrode.

Hereinafter, the present invention will be described in detail with reference to examples. It is to be understood, however, that these examples are for illustrative purposes and are not intended to limit the scope of the present invention.

EXAMPLE 1

The silicon solar cell module according to the present invention was fabricated by the following process.

To fabricate the silicon solar cell, a p-type single-crystal silicon substrate (165×165 mm; thickness: 180 μm) was used. $POCl_3$ was thermally diffused into the front surface of the silicon substrate to form an n-type layer, thereby forming a p-n junction in the silicon substrate. On the n-type layer, a silicon nitride layer was deposited to form an antireflective layer. To form a front electrode on the antireflective layer of the silicon substrate, a high-temperature silver paste was screen-printed on the antireflective layer to form finger lines having a width of 100 μm. An aluminum paste was applied to the entire rear surface of the silicon substrate. The electrode pastes on the front and rear surfaces were calcined at a temperature of 910° C. During this calcining process, the silver paste of the front electrode penetrated through the antireflective layer so as to be connected to the n-type layer. The conductive paste of the present invention was screen-printed and calcined at a temperature of 220° C. to form two bus bars having a width of 2 mm on the front electrode finger lines and on the rear electrode. The conductive paste used in this Example was a mixture of copper powder as metal powder, $Sn_{63}Pb_{37}$ solder as solder powder, epoxy resin as curable resin, phthalic acid as a curing agent, and butyl cabitol as a buffer.

As metal ribbons connecting the cells to one another, solder-coated copper ribbons were used to connect the above-fabricated silicon solar cell modules to one another, thereby fabricating a silicon solar cell array. The array was encapsulated with EVA resin. Low-iron-reinforced glass was laminated on the front surface, and Tedlar (DuPont) as a back sheet was laminated on the rear surface.

For comparison with the photovoltaic conversion efficiency of the silicon solar cell module fabricated according to the present invention, a conventional silicon solar cell module was fabricated in the same manner as the above-described method for fabricating the silicon solar cell module of the present invention, except that a high-temperature silver paste for forming front electrode bus bars and an aluminum/silver paste for forming rear electrode bus bars were screen-printed and calcined at a temperature of 910° C. or higher, and the photovoltaic conversion efficiency thereof was compared with that of the silicon solar cell module of the present invention. The results of the comparison indicated that the photovoltaic conversion efficiency of the conventional silicon cell module was 14.5% and the photovoltaic conversion efficiency of the silicon solar cell module of the present invention was 14.6%. The reason why the photovoltaic conversion efficiency of the silicon solar cell module of the present invention increased is that the front electrode finger lines and the front electrode bus bars were separately formed so that the area of contact between the silicon substrate and the front electrode was reduced, thereby inhibiting the decrease in electric current caused by the recombination of electrons and holes resulting from this contact.

INDUSTRIAL APPLICABILITY

The present invention relates to a silicon solar cell module comprising electrodes formed from conductive paste. In the present invention, rear electrode bus bars and front electrode bus bars are formed by printing a conductive paste including a buffer and a curing agent having reducing power and calcining the printed paste at low temperature, whereby 60% or more of an expensive silver paste is replaced with the inexpensive low-temperature conductive paste, thereby reducing the production cost. Because the front electrode bus bars formed from the conductive paste according to the present invention do not come into contact with the silicon substrate, the area of contact between the silicon substrate and the front electrode is reduced by 40% or more, and thus the decrease in electric current caused by the recombination of electrons and holes resulting from this contact is inhibited, thereby increasing the photovoltaic conversion efficiency of the cell. In addition, when the conductive paste according to the present invention is used, the rear electrode and front electrode bus bars can be calcined at low temperature, and thus the occurrence of cracks in the silicon substrate can be reduced, thereby preventing a decrease in the photovoltaic conversion efficiency of the silicon solar cell and increasing the yield of the cell.

What is claimed is:

1. A silicon solar cell module comprising:
   (1) a plurality of silicon solar cells, each comprising:
      (a) a silicon substrate having a p-n junction near the front surface of the substrate;
      (b) a first electrode electrically and mechanically connected to the rear surface of the silicon substrate;
      (c) an array of third elongate parallel electrodes electrically and mechanically connected to the front surface of the silicon substrate;
      (d) at least one fourth electrode connected electrically and mechanically to the third electrodes and being at a distance from the front surface of the silicon substrate and formed of a conductive paste comprising solder powder, metal powder and a resin comprising a curing agent having reducing power,
      wherein the conductive paste of the fourth electrode is different from the third elongate parallel electrodes,
      wherein calcining temperature of the fourth electrode is under 300° C.; and
      (e) an antireflective layer covering the third electrodes on the front surface of the silicon substrate;
   (2) a plurality of metal ribbons that provide a connection between the plurality of silicon solar cells;
   (3) an encapsulation resin encapsulating the plurality of silicon solar cells and the plurality of metal ribbons;
   (4) a front glass substrate placed on the upper side of the encapsulation resin; and
   (5) a back sheet placed on the lower side of the encapsulation resin.

2. The silicon solar cell module of claim 1, wherein the solder powder comprises at least one selected from the group consisting of Sn, Pb, Bi, Zn, Ga, Hg, Sb, In, and alloys thereof.

3. The silicon solar cell module of claim 1, wherein the solder powder is $Sn^{63}Pb_{37}$.

4. The silicon solar cell module of claim 1, wherein the metal powder comprises at least one selected from the group consisting of copper, nickel, silver, gold, aluminum, platinum, iron, cobalt, molybdenum, and alloys thereof.

5. The silicon solar cell module of claim 1, wherein the metal powder is copper.

6. The silicon solar cell module of claim 1, wherein the curing agent having reducing power comprises at least one selected from among phthalic acids, phthalic anhydrides, and carboxylic anhydrides.

7. The silicon solar cell module of claim 1, further comprising a buffer.

8. The silicon solar cell module of claim 7, wherein the buffer comprises at least one selected from among alcohols, glycols, and polyols.

9. The silicon solar cell module of claim 1, wherein the resin is a curable resin.

10. The silicon solar cell module of claim 9, wherein the curable resin comprises at least one selected from among an epoxy resin and a phenolic resin.

11. A method for fabricating a silicon solar cell module, the method comprising the steps of:
   (1) fabricating a plurality of silicon solar cells by:
      (a) fabricating a silicon substrate having a p-n junction near the front surface of the silicon substrate;
      (b) forming an antireflective layer on the silicon substrate;
      (c) printing and calcining a metal paste on the rear surface of the silicon substrate to form a first electrode;
      (d) printing and calcining a glass frit-containing metal paste on the front surface of the silicon substrate to a third electrode; and
      (e) printing and calcining a conductive paste of on the third electrode to form a fourth electrode, the conductive paste comprising solder powder, metal powder and a resin comprising a curing agent having reducing power, wherein,
      the fourth electrode is connected electrically and mechanically to the third electrode and is distanced from the front surface of the silicon substrate,
      the conductive paste of the fourth electrode is different from the third electrode, and
      calcining temperature of the fourth electrode is under 300° C.;
   (2) connecting the plurality of silicon solar cells to one another by a plurality of metal ribbons, thereby fabricating a silicon solar cell array; and
   (3) encapsulating the silicon solar cell array with an encapsulation resin and laminating a glass substrate on the upper surface of the encapsulation resin and a back sheet on the lower surface of the encapsulation resin, thereby fabricating a silicon solar cell module.

12. A silicon solar cell module comprising:
   (1) a plurality of silicon solar cells, each comprising:
      (a) a silicon substrate having a p-n junction near the front surface of the substrate;
      (b) a first electrode electrically and mechanically connected to the rear surface of the silicon substrate;
      (c) at least one second electrode connected electrically and mechanically connected to the first electrode on the rear surface of the silicon substrate and formed of a conductive paste, which comprises solder powder, metal powder and a resin comprising a curing agent having reducing power, so as to be electrically and mechanically connected to metal ribbons that provide a connection between the plurality of silicon solar cells,
      wherein the conductive paste of the second electrode is different from the first electrode,
      wherein calcining temperature of the second electrode is under 300° C.;
      (d) an array of third elongate and parallel electrodes electrically and mechanically connected to the front surface of the silicon substrate;
      (e) at least one fourth electrode electrically and mechanically connected to the third electrodes; and
      (f) an antireflective layer that covers the third electrodes on the front surface of the silicon substrate and comes into contact with the silicon substrate;

(2) a plurality of metal ribbons that provide a connection between the plurality of silicon solar cells;

(3) an encapsulation resin encapsulating the plurality of silicon solar cells and the plurality of metal ribbons;

(4) a front glass substrate placed on the upper side of the encapsulation resin; and (5) a back sheet placed on the lower side of the encapsulation resin.

13. The silicon solar cell module of claim 12, wherein the solder powder is contained in an amount of 1-60 wt %, and comprises at least one selected from the group consisting of Sn, Pb, Bi, Zn, Ga, Hg, Sb, In, and alloys thereof.

14. The silicon solar cell module of claim 12, wherein the solder powder is SnPb.

15. The silicon solar cell module of claim 12, wherein the metal powder is contained in an amount of 0-60 wt %, and comprises at least one selected from the group consisting of copper, nickel, silver, gold, aluminum, platinum, iron, cobalt, molybdenum, and alloys thereof.

16. The silicon solar cell module of claim 12, wherein the metal powder is copper.

17. The silicon solar cell module of claim 12, wherein the curing agent having reducing power comprises at least one selected from among phthalic acids, phthalic anhydrides, and carboxylic anhydrides.

18. The silicon solar cell module of claim 12, further comprising a buffer.

19. The silicon solar cell module of claim 18, wherein the buffer is contained in an amount of 0-50 wt %, and comprises at least one selected from among alcohols, glycols, and polyols.

20. The silicon solar cell module of claim 12, wherein the resin is contained in an amount of 0-50 wt %, and is a curable resin.

* * * * *